(12) United States Patent
Reznicek et al.

(10) Patent No.: US 10,269,698 B1
(45) Date of Patent: Apr. 23, 2019

(54) BINARY METALLIZATION STRUCTURE FOR NANOSCALE DUAL DAMASCENE INTERCONNECTS

(71) Applicant: International Business Machines Corporation, Armonk, NY (US)

(72) Inventors: Alexander Reznicek, Troy, NY (US); Oscar van der Straten, Guilderland Center, NY (US); Praneet Adusumilli, Somerset, NJ (US); Koichi Motoyama, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/849,046

(22) Filed: Dec. 20, 2017

(51) Int. Cl.
*H01L 21/321* (2006.01)
*H01L 21/768* (2006.01)
*H01L 23/522* (2006.01)
*H01L 23/532* (2006.01)
*H01L 21/3213* (2006.01)

(52) U.S. Cl.
CPC .... *H01L 23/5226* (2013.01); *H01L 21/32115* (2013.01); *H01L 21/32133* (2013.01); *H01L 21/7684* (2013.01); *H01L 21/76808* (2013.01); *H01L 21/76813* (2013.01); *H01L 21/76843* (2013.01); *H01L 21/76865* (2013.01); *H01L 21/76877* (2013.01); *H01L 23/53223* (2013.01);
(Continued)

(58) Field of Classification Search
CPC ........... H01L 21/32115; H01L 23/5226; H01L 21/32133; H01L 21/76808
See application file for complete search history.

(56) References Cited

U.S. PATENT DOCUMENTS

| | | | |
|---|---|---|---|
| 5,731,635 | A | 3/1998 | Bareither et al. |
| 6,159,847 | A | 12/2000 | Havemann et al. |

(Continued)

OTHER PUBLICATIONS

Van Der Veen et al., "Cobalt bottom-up contact and via prefill enabling advanced logic and DRAM technologies", 2015 IEEE International Interconnect Technology Conference and /2015 IEEE Materials for Advanced Metallization Conference (IITC/AMC), Date of Conference: May 18-21, 2015, pp. 25-28, Conference Location: Grenoble, France.

(Continued)

*Primary Examiner* — Elias Ullah
(74) *Attorney, Agent, or Firm* — Scully, Scott, Murphy & Presser, P.C.; Daniel P. Morris, Esq.

(57) ABSTRACT

A structure is provided that includes a lower interconnect level that includes a first interconnect dielectric material layer having an opening that contains a first bimetallization interconnect structure. An upper interconnect level is located above the lower interconnect level. The upper interconnect level includes a second interconnect dielectric material layer having a combined via/line opening, wherein the line portion of the combined via/line opening contains a second bimetallization interconnect structure. In accordance with the present application, the first and second bimetallization interconnect structures comprises a first electrically conductive structure composed of a first electrically conductive metal or metal alloy material having a first bulk resistivity surrounding a second electrically conductive structure composed of a second electrically conductive metal or metal alloy material having a second bulk resistivity that is less than the first bulk resistivity and a grain size greater than 10 nm.

10 Claims, 9 Drawing Sheets

(52) U.S. Cl.
CPC .. *H01L 23/53238* (2013.01); *H01L 23/53252* (2013.01)

(56) References Cited

U.S. PATENT DOCUMENTS

| | | |
|---|---|---|
| 6,599,828 B1 | 7/2003 | Gardner |
| 7,115,999 B2 | 10/2006 | Tsumura et al. |
| 7,514,354 B2 | 4/2009 | Park et al. |
| 8,232,646 B2 | 7/2012 | Bonilla et al. |
| 8,575,028 B2 | 11/2013 | Reid et al. |
| 9,716,063 B1 | 7/2017 | Edelstein et al. |
| 9,748,173 B1 | 8/2017 | Murray et al. |
| 9,754,883 B1 | 9/2017 | Briggs et al. |
| 2009/0169760 A1 | 7/2009 | Akolkar et al. |
| 2012/0205804 A1 | 8/2012 | McFeely et al. |
| 2013/0026635 A1 | 1/2013 | Yang et al. |
| 2016/0071791 A1 | 3/2016 | Huang et al. |
| 2016/0358815 A1 | 12/2016 | Yu et al. |
| 2017/0170062 A1 | 6/2017 | Murray et al. |
| 2017/0200642 A1 | 7/2017 | Shaviv et al. |

OTHER PUBLICATIONS

Jiang et al., "Development of electroless Co via-prefill to enable advanced BEOL metallization and via resistance reduction", 2016 IEEE International Interconnect Technology Conference/Advanced Metallization Conference (IITC/AMC), Date of Conference: May 23-26, 2016 pp. 111-113, Conference Location: San Jose, CA, USA.

Zhang et al., "Ruthenium interconnect resistivity and reliability at 48 nm pitch", 2016 IEEE International Interconnect Technology Conference/Advanced Metallization Conference (IITC/AMC), Date of Conference: May 23-26, 2016 pp. 31-33, Conference Location: San Jose, CA, USA.

BINARY METALLIZATION STRUCTURE FOR NANOSCALE DUAL DAMASCENE INTERCONNECTS

BACKGROUND

The present application relates to semiconductor technology. More particularly, the present application relates to a semiconductor structure, e.g., a dual damascene interconnect structure, that includes lower and upper interconnect levels that both contain binary metallization structures (i.e., first and second electrically conductive structures) embedded within an interconnect dielectric material layer present in the specific interconnect level. The present application also provides a method of forming such a structure.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring, i.e., interconnect, structures.

Within typical dual damascene interconnect structures, electrically conductive metal vias run perpendicular to the semiconductor substrate and electrically conductive metal lines run parallel to the semiconductor substrate. Typically, the electrically conductive metal vias are present beneath the electrically conductive metal lines and both features are embedded within an interconnect dielectric material layer.

In conventional dual damascene interconnect structures, copper or a copper containing alloy has been used as the material of the electrically conductive metal vias and lines. In recent years, advanced dual damascene interconnect structures containing a combined electrically conductive via/line feature have been developed in which an alternative metal such as cobalt or ruthenium is used as a liner in conjunction with, copper or a copper alloy. In such cases, copper voids are typically formed in the via and line portions of the damascene interconnect structure and the copper grain size is often small (less than 5 nm). Such advanced dual damascene interconnect structure may exhibit poor electromigration performance.

There is thus a need for providing advanced dual damascene interconnect structures including both copper and an alternative metal which exhibit void-free vias as well as void-free, large-grained copper lines.

SUMMARY

In one aspect of the present application, a semiconductor structure is provided. In one embodiment, the semiconductor structure may include a lower interconnect level that includes a first interconnect dielectric material layer having an opening that contains a first bimetallization interconnect structure. An upper interconnect level is located above the lower interconnect level. The upper interconnect level includes a second interconnect dielectric material layer having a combined via/line opening, wherein the line portion of the combined via/line opening contains a second bimetallization interconnect structure. In accordance with the present application, the first and second bimetallization interconnect structures comprise a first electrically conductive structure composed of a first electrically conductive metal or metal alloy material having a first bulk resistivity surrounding a second electrically conductive structure composed of a second electrically conductive metal or metal alloy material having a second bulk resistivity that is less than the first bulk resistivity and a grain size greater than 10 nm.

In another aspect of the present application, a method of forming a semiconductor structure is provided. In one embodiment, the method may include forming a lower interconnect level comprising a first interconnect dielectric material layer having an opening that contains a first bimetallization interconnect structure embedded therein. Next, an upper interconnect level is formed above the lower interconnect level, the upper interconnect level comprises a second interconnect dielectric material layer having a combined via/line opening, wherein the line portion of the combined via/line opening contains a second bimetallization interconnect structure embedded therein, In the present application, the first and second bimetallization interconnect structures comprise a first electrically conductive structure composed of a first electrically conductive metal or metal alloy material having a first bulk resistivity surrounding a second electrically conductive structure composed of a second electrically conductive metal or metal alloy material having a second bulk resistivity that is less than the first bulk resistivity and a grain size greater than 10 nm.

DETAILED DESCRIPTION

Figure 1:
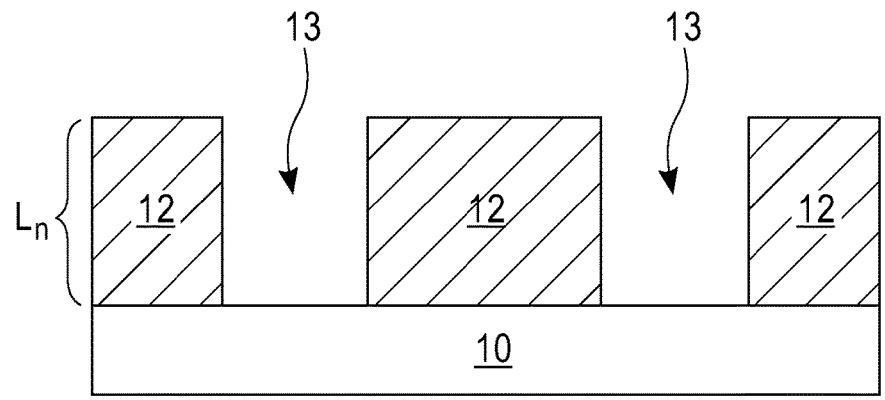
FIG. 1 is a cross sectional view of an exemplary semiconductor structure that can be employed in accordance with an embodiment of the present application, and including a first interconnect dielectric material layer of a lower interconnect level located on a surface of a substrate, wherein the first interconnect dielectric material layer includes at least one opening located therein.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary semiconductor structure that can be employed in accordance with an embodiment of the present application. Notably, the exemplary semiconductor structure of FIG. 1 includes a first interconnect dielectric material layer 12 of a lower interconnect level, $L_n$, located on a surface of a substrate 10. As is shown, the first interconnect dielectric material layer 12 includes at least one opening 13 located therein.

Substrate 10 may include a semiconductor substrate that contains one or more semiconductor devices such as, for example, transistors, capacitors, resistors, etc. formed on a surface of the semiconductor substrate, or within the semiconductor substrate itself.

The first interconnect dielectric material layer 12 of the lower interconnect level, $L_n$, may be composed of an inorganic dielectric material or an organic dielectric material. In some embodiments, first interconnect dielectric material layer 12 may be porous. In other embodiments, the first interconnect dielectric material layer 12 may be non-porous. Examples of suitable dielectric materials that may be employed as the first interconnect dielectric material layer 12 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The first interconnect dielectric material layer 12 may have a dielectric constant (all dielectric constants mentioned herein are measured relative to a vacuum, unless otherwise stated) that is about 4.0 or less. In one embodiment, the first interconnect dielectric material layer 12 has a dielectric constant of 2.8 or less. These dielectrics generally having a lower parasitic cross talk as compared to dielectric materials whose dielectric constant is greater than 4.0.

The first interconnect dielectric material layer 12 may be formed by a deposition process such as, for example, chemical vapor deposition (CVD), plasma enhanced chemical vapor deposition (PECVD) or spin-on coating. The first interconnect dielectric material layer 12 may have a thickness from 50 nm to 250 nm. Other thicknesses that are lesser than 50 nm, and greater than 250 nm can also be employed in the present application.

After providing the first interconnect dielectric material layer 12, at least one opening 13 (two of which are shown by way of one example in FIG. 1) is formed into the first interconnect dielectric material layer 12. The at least one opening 13 in the first interconnect dielectric material layer 12 may be a via opening or a line opening. The at least one opening 13 may be formed by lithography and etching. As is shown, the at least one opening 13 exposes a surface of the underlying substrate 10.

Figure 2:
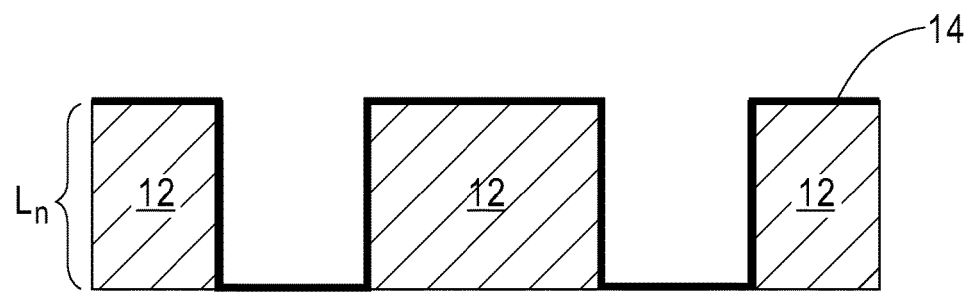
FIG. 2 is a cross sectional view of the exemplary semiconductor structure of FIG. 1 after forming a first nucleation layer on physically exposed surfaces of the first interconnect dielectric material layer.

Referring now to FIG. 2, there is illustrated the exemplary semiconductor structure of FIG. 1 after forming a first nucleation layer 14 on physically exposed surfaces of the first interconnect dielectric material layer 12; substrate 10 has been omitted from FIG. 2 and the remaining drawings of the present application, for clarity. As is shown, the first nucleation layer 14 is present on a topmost surface of the first interconnect dielectric material layer 12 and completely lines the at least one opening 13.

The first nucleation layer 14 may be composed of Ru, RuTi, RuTa, RuNb, RuW, Ta, TaTi, TW, TaNb, TaMo, Ta/TiN, TaNbN, TaWN, TaMoN, Ti, TiN, TiTaN, W or WN. In some embodiments, multi-component nucleation layers such as, for example, RuTi, RuTa, etc., are preferred over single component nucleation layers such as, for example, Ru, since multi-component nucleation layers provide reduced nucleation layer resistivity as compared to their single component nucleation layer counterparts.

The first nucleation layer 14 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating. The first nucleation layer 14 may have a thickness from 0.5 nm to 20 nm. Other thickness are contemplated and can be employed in the present application as long as the first nucleation layer 14 does not entirely fill the at least one opening 13.

Figure 3:
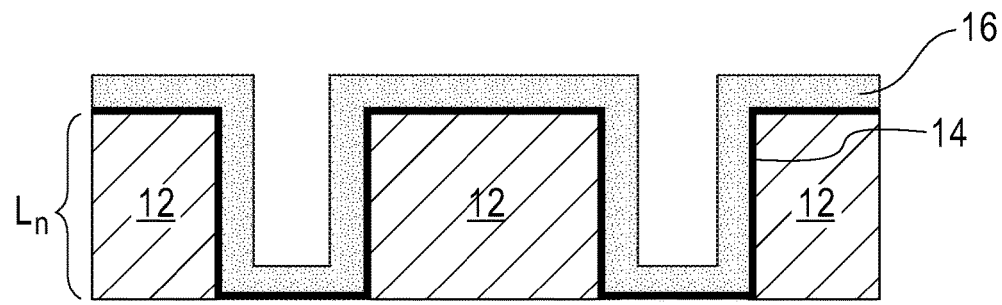
FIG. 3 is a cross sectional view of the exemplary semiconductor structure of FIG. 2 after forming a first electrically conductive metal or metal alloy layer having a first bulk resistivity on the first nucleation layer.

Referring now to FIG. 3, there is illustrated the exemplary semiconductor structure of FIG. 2 after forming a first electrically conductive metal or metal alloy layer 16 having a first bulk resistivity on the first nucleation layer 14. Bulk resistivity (or volume resistivity) is a constant value for a certain material at a certain environment (typically measured at 20° C.). The bulk resistivity is a measure of the resistivity across a defined thickness of the material. The first bulk resistivity of the first electrically conductive metal or metal alloy layer 16 is typically within a range from to 3.5 µΩ·cm to 8.0 µΩ·cm, wherein µΩ equals microohms.

The electrically conductive metal or metal alloy that provides the first electrically conductive metal or metal alloy layer 16 may include, but is not limited to, cobalt (Co), ruthenium (Ru), rhodium (Rh), iridium (Ir), tungsten (W), nickel (Ni), osmium (Os), palladium (Pd), platinum (Pt) or alloys thereof. The first electrically conductive metal or metal alloy layer 16 may be formed utilizing a deposition process such as, for example, chemical vapor deposition (CVD), atomic layer deposition (ALD), physical vapor deposition (PVD) or plating. The first electrically conductive metal or metal alloy layer 16 may have a thickness from 10 nm to 50 nm. Other thicknesses are contemplated and can be employed in the present application as long as the first electrically conductive metal or metal alloy layer 16 does not entirely fill the at least one opening 13.

Figure 4:
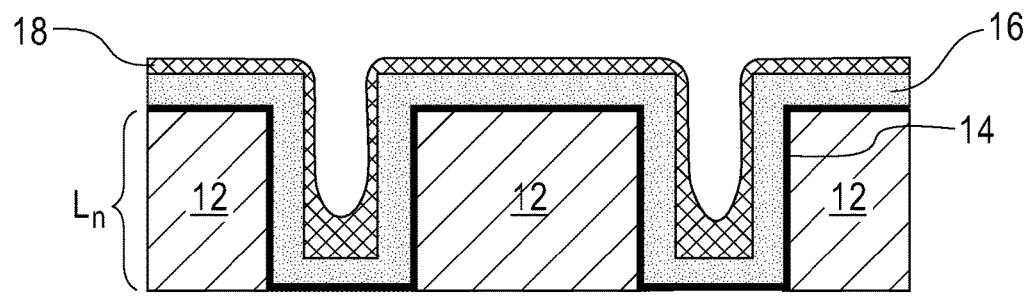
FIG. 4 is a cross sectional view of the exemplary semiconductor structure of FIG. 3 after forming a second electrically conductive metal or metal alloy layer having a second bulk resistivity that is less than the first bulk resistivity and a first grain size on the first electrically conductive metal or metal alloy.

Referring now to FIG. 4, there is illustrated the exemplary semiconductor structure of FIG. 3 after forming a second electrically conductive metal or metal alloy layer 18 having a second bulk resistivity that is less than the first bulk resistivity and a first grain size on the first electrically conductive metal or metal alloy layer 16.

The second bulk resistivity is typically within a range from 1.5 µΩ·cm to 3.0 µΩ·cm, wherein µΩ equals microohms. The electrically conductive metal or metal alloy that provides the second electrically conductive metal or metal alloy layer 18 may include, but is not limited to, copper (Cu), aluminum (Al), or a copper-aluminum (Cu—Al) alloy in which the content of copper may be greater than, equal to, or less than the content of aluminum. The first grain size of the electrically conductive metal or metal alloy that provides the second electrically conductive metal or metal alloy layer 18 is typically less than 5 nm. In some embodiments, the first grain size can be from 1 nm to 10 nm.

The second electrically conductive metal or metal alloy layer 18 may be formed utilizing a high biased physical vapor deposition (PVD) process which provides the first grain size and a super-conformal second electrically conductive metal or metal alloy layer 18 coverage. By "high biased" it is meant, a bias of 300 W or greater. The second electrically conductive metal or metal alloy layer 18 may have a thickness from 2 nm to 10 nm. Other thicknesses are contemplated and can be employed in the present application.

Figure 5:
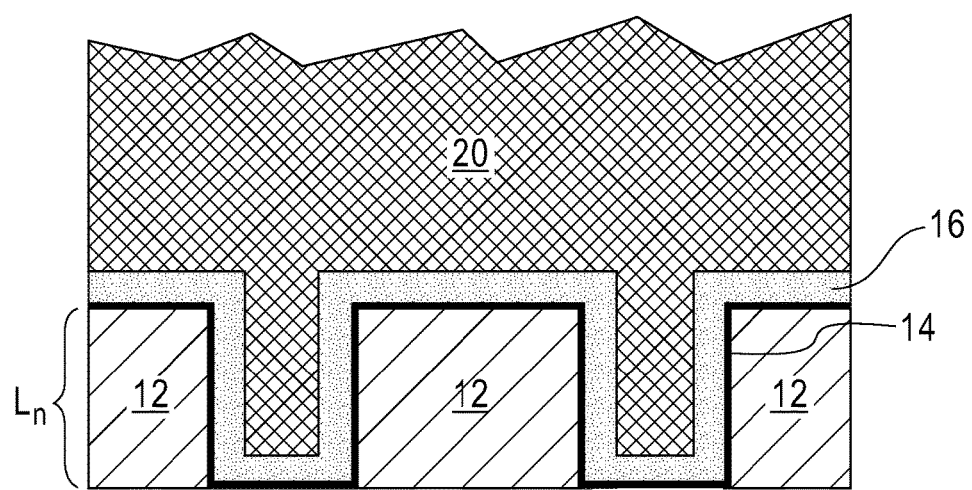
FIG. 5 is a cross sectional view of the exemplary semiconductor structure of FIG. 4 after performing a reflow anneal to reflow and convert the second electrically conductive metal or metal alloy layer into a modified second electrically conductive metal or metal alloy layer having the second bulk resistivity and a second grain size that is greater than the first grain size.

Referring now to FIG. 5, there is illustrated the exemplary semiconductor structure of FIG. 4 after performing a reflow anneal to reflow and convert the second electrically conductive metal or metal alloy layer 18 into a modified second electrically conductive metal or metal alloy layer 20 having the second bulk resistivity and a second grain size that is greater than the first grain size. In one embodiment, the second grain size of the modified second electrically conductive metal or metal alloy 20 is greater than 10 nm. In some embodiments, the second grain size is from 12 nm to 25 nm.

The reflow anneal may include a furnace anneal or a laser anneal; laser annealing is typically performed for a shorter period of time than furnace annealing. The reflow anneal is performed at a temperature that melts the conductive metal or metal alloy that provides the second electrically conductive metal or metal alloy layer 18. In one embodiment, the reflow anneal is performed at a temperature from 100° C. to 450° C.

Depending on the thickness of the initial second electrically conductive metal or metal alloy layer 18 and the feature size of the at least one opening 13, the above steps of depositing a second electrically conductive metal or metal alloy layer 18 and performing a reflow anneal may be performed multiple times so as to completely fill in the at least one opening 13 with the modified second electrically conductive metal or metal alloy layer 20 having the second bulk resistivity and the second grain size. In some embodiments, and as shown in FIG. 5, the modified second electrically conductive metal or metal alloy layer 20 has an overburden portion that extends outside of each opening 13 and atop the first interconnect dielectric material layer 12.

Figure 6:
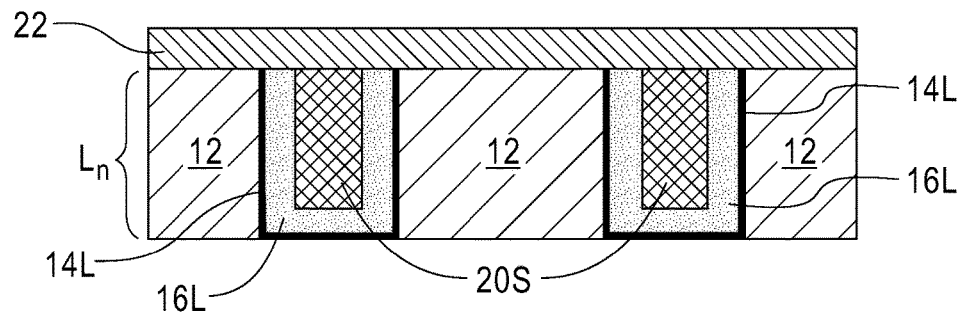
FIG. 6 is a cross sectional view of the exemplary semiconductor structure of FIG. 5 after performing a planarization process, and forming a dielectric capping layer.

Referring now to FIG. 6, there is illustrated the exemplary semiconductor structure of FIG. 5 after performing a planarization process, and forming a dielectric capping layer 22. The planarization process that can be employed in the present application may include, for example, chemical mechanical polishing (CMP) and/or grinding. The planarization process removes any material that is located outside each opening 13 and above the topmost surface of the first interconnect dielectric material layer 12. The planarization stops on a topmost surface of the first interconnect dielectric material layer 12.

At this point of the present application, the planarization process removes the overburden portion of the modified second electrically conductive metal or metal alloy layer 20, the portions of first electrically conductive metal or metal alloy layer 16, and the portions of the nucleation layer 14 that are located outside the at least one opening 13 and atop the first interconnect dielectric material layer 12 from the structure. The remaining portion of the first nucleation layer 14 that is present in the at least one opening 13 is referred to herein as a first nucleation liner 14L, the remaining portion of the first electrically conductive metal or metal alloy layer that is present in the at least one opening 13 may be referred to herein as a first electrically conductive metal or metal alloy liner 16L, and the remaining modified second electrically conductive metal or metal alloy 20 that is present in the at least one opening 13 may be referred to as second electrically conductive structure 20S. As is shown, the first nucleation liner 14L and the first electrically conductive metal or metal alloy liner 16L are U-shaped and surround the second electrically conductive structure 20S.

Collectively, the first electrically conductive metal or metal alloy liner 16L, and the second electrically conductive structure 20S that are located in the first opening 13 and embedded in the first interconnect dielectric material layer 12 provide a binary metallization interconnect structure of the lower interconnect level, $L_n$.

At this point of the present application, the first nucleation liner 14L, the first electrically conductive metal or metal alloy liner 16L, and the second electrically conductive structure 20S have topmost surfaces that are coplanar with each other as well as being coplanar with a topmost surface of the first interconnect dielectric material layer 12.

In some embodiments and is illustrated in FIG. 6, dielectric capping layer 22 can be formed on the physically exposed topmost surface of the lower interconnect level, $L_n$, of the present application. In some embodiments, dielectric capping layer 22 can be omitted. When present, the dielectric capping layer 22 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The dielectric material that provides the dielectric capping layer 22 may be formed utilizing a deposition process such as, for example, CVD, PECVD, ALD, chemical solution deposition or evaporation. When present, dielectric capping layer 22 may have a thickness from 10 nm to 100 nm. Other thicknesses that are lesser than 10 nm, or greater than 100 nm may also be used as the thickness of the dielectric capping layer 22.

Figure 7:
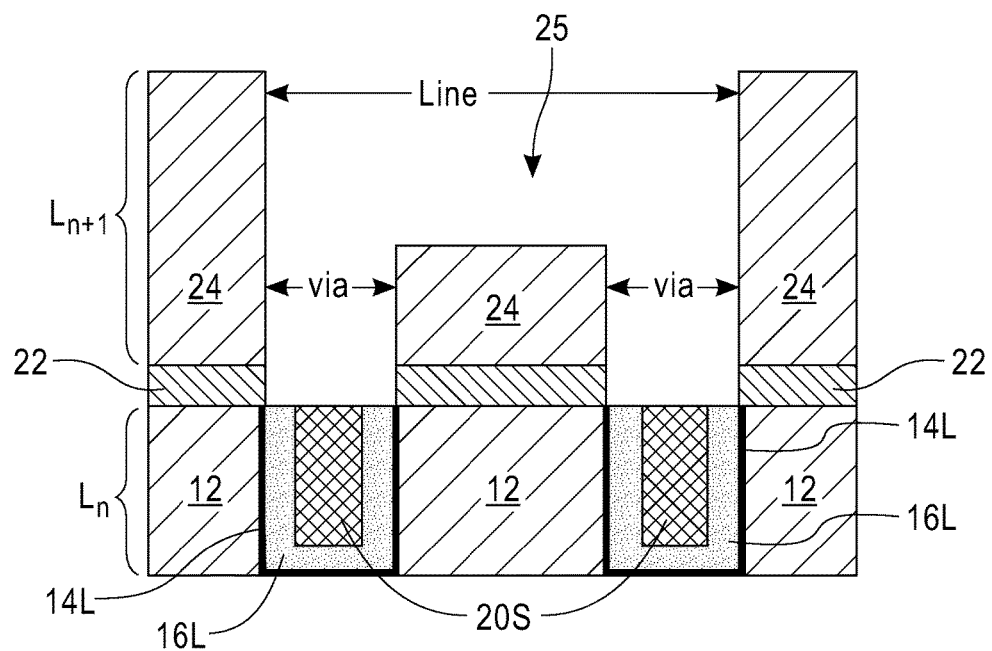
FIG. 7 is a cross sectional view of the exemplary semiconductor structure of FIG. 6 after forming a second interconnect dielectric material layer of an upper interconnect level over the lower interconnect level, and forming at least one combined via/line opening in the second interconnect dielectric material layer.

Referring now to FIG. 7, there is illustrated the exemplary semiconductor structure of FIG. 6 after forming a second interconnect dielectric material layer 24 of an upper interconnect level, $L_{n+1}$, over the lower interconnect level, $L_n$. and forming at least one combined via/line opening 25 in the second interconnect dielectric material layer 24. In some embodiments, and as illustrated, the at least one via/line opening 25 may include two via openings connected to a single line opening. In other embodiments, only a single via opening or more than two via openings is(are) present in the combined via/line opening 25 that is provided to the second interconnect dielectric material layer 24.

The second interconnect dielectric material layer 24 may include one of the interconnect dielectric materials mentioned above for the first interconnect dielectric material layer 12. In some embodiments, the second interconnect dielectric material layer 24 includes a same interconnect dielectric material as the first interconnect dielectric material layer 12. In other embodiments, the second interconnect dielectric material layer 24 includes a different interconnect dielectric material than the first interconnect dielectric material layer 12. The second interconnect dielectric material layer 24 may be porous or non-porous, have a thickness within the thickness range of the first interconnect dielectric material layer 12, and be formed utilizing one of the deposition processes used in providing the first interconnect dielectric material layer 12.

Next, a combined via/line opening 25 can be formed into the second interconnect dielectric material layer 24. During or, after, the formation of the via portion of the combined via/line opening 25, the dielectric capping layer 22 can be opened as is shown in FIG. 7. The combined via/line opening 25 is formed utilizing a dual damascene process as known in the art. As is shown in FIG. 7, the line portion of the combined via/line opening 25 is located above each via portion of the combined via/line opening 25.

The opening of the dielectric capping layer 22 physically exposes the topmost surfaces of the binary metallization interconnect structure (i.e., the first electrically conductive metal or metal alloy liner 16L, and the second electrically conductive structure 20S) that is embedded in the first interconnect dielectric material layer 12.

Figure 8:
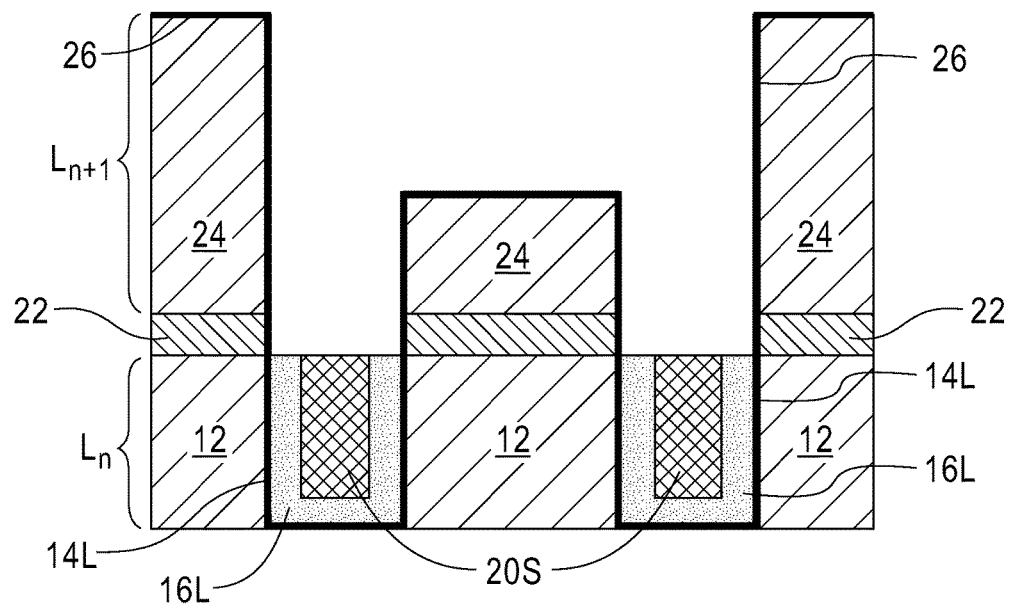
FIG. 8 is a cross sectional view of the exemplary semiconductor structure of FIG. 7 after forming a second nucleation layer and removing the second nucleation layer that is present on the topmost surface of a binary metallization interconnect structure that is present in the lower interconnect level.

Referring now to FIG. 8, there is illustrated the exemplary semiconductor structure of FIG. 7 after forming a second nucleation layer 26 and removing the second nucleation layer 26 that is present on the topmost surface of the binary metallization interconnect structure (16L, 20S) that is present in the lower interconnect level, $L_n$.

The second nucleation layer 26 that can be used in the present application includes one of the materials mentioned above for the first nucleation layer 14. In one embodiment, the first and second nucleation layers (14, 26) comprise a same material. In another embodiment, the first nucleation layer 14 comprises a different material than the second nucleation layer 26. The second nucleation layer 26 may be formed utilizing one of the techniques mentioned above for forming the first nucleation layer 14. The second nucleation layer 26 may have a thickness within the thickness range mentioned above for the first nucleation layer 26.

The removal of the second nucleation layer 26 that is present on the topmost surface of the binary metallization interconnect structure (16L, 20S) that is present in the lower interconnect level, $L_n$ can be performed utilizing directional Ar sputtering. The second nucleation layer 26 that remains after directional Ar sputtering is located on physically exposed surfaces of the second interconnect dielectric material layer 24. When a dielectric capping layer 22 is present, the second nucleation layer 26 is also present on the sidewalls of the opened dielectric capping layer 22.

Figure 9:
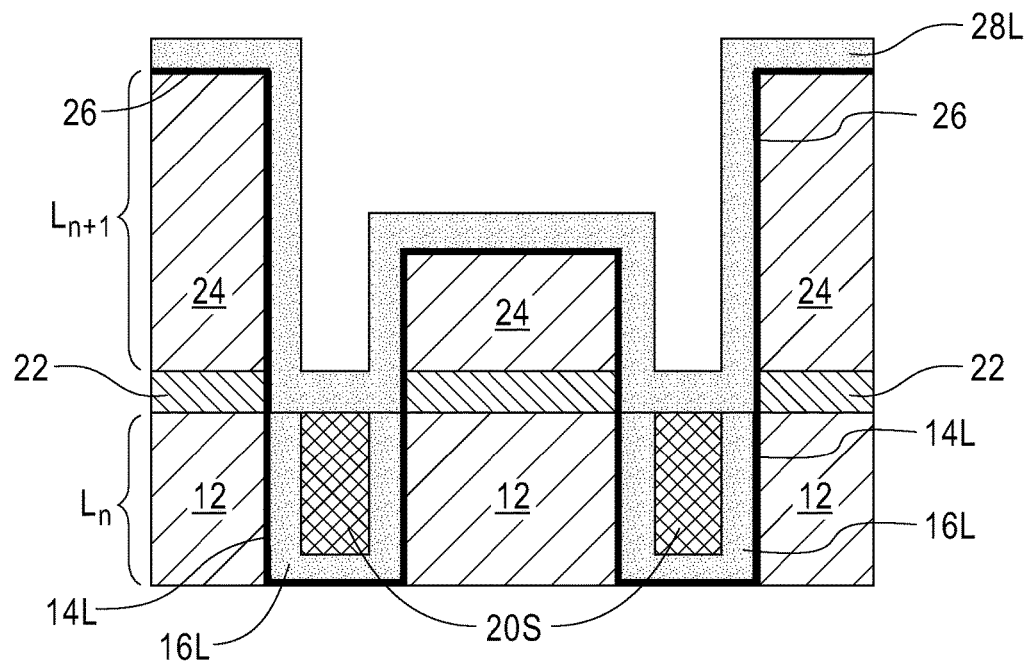
FIG. 9 is a cross sectional view of the exemplary semiconductor structure of FIG. 8 after forming another first electrically conductive metal or metal alloy layer having the first bulk resistivity.

Referring now to FIG. 9, there is illustrated the exemplary semiconductor structure of FIG. 8 after forming another first electrically conductive metal or metal alloy layer 28L having the first bulk resistivity. The another first electrically conductive metal or metal alloy layer 28L is composed of a same electrically conductive metal or metal alloy as that which provided the first electrically conductive metal or metal alloy layer 16. In the drawing, a boundary line is shown between the first electrically conductive metal or metal alloy liner 16L and the another first electrically conductive metal or metal alloy layer 28L for clarity reasons only; in reality no boundary (material interface) would be present between 16L and 28L. The another first electrically conductive metal or metal alloy layer 28L may be formed utilizing one of the techniques mentioned previously for forming the first electrically conductive metal or metal alloy layer 16. The another first electrically conductive metal or metal alloy layer 28L has a thickness within the range mentioned previously for the first electrically conductive metal or metal alloy layer 16.

Figure 10:
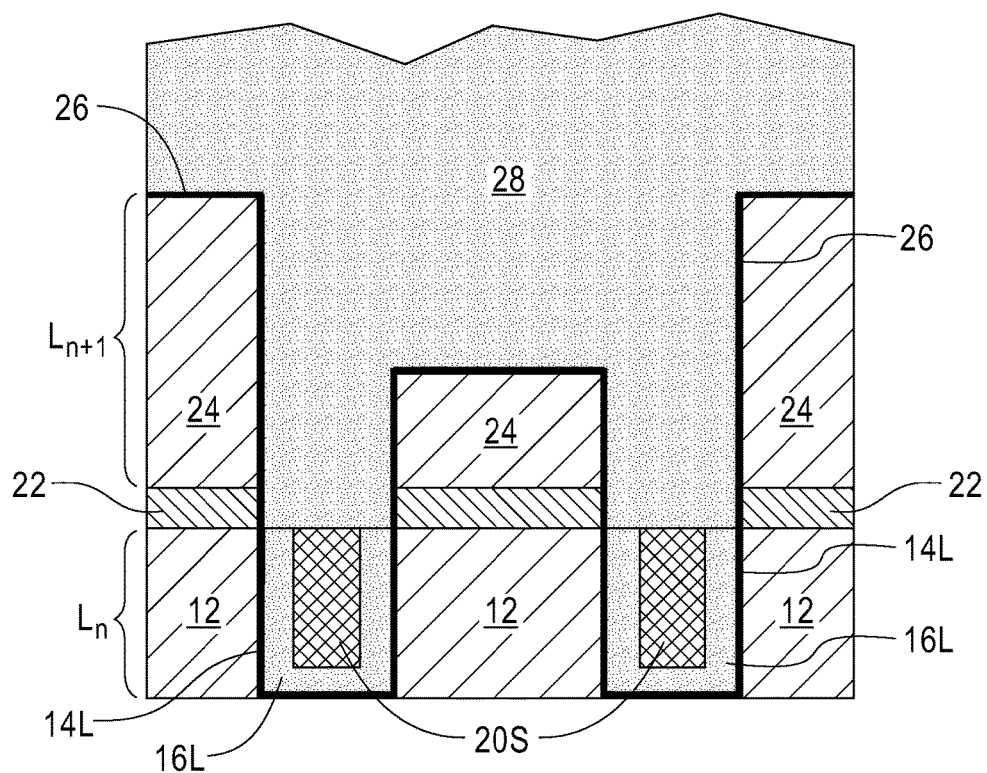
FIG. 10 is a cross sectional view of the exemplary semiconductor structure of FIG. 9 after forming additional first electrically conductive metal or metal alloy material on the another first electrically conductive metal or metal alloy layer to completely fill in the combined via/line opening.

Referring now to FIG. 10, there is illustrated the exemplary semiconductor structure of FIG. 9 after forming additional first electrically conductive metal or metal alloy material on the another first electrically conductive metal or metal alloy layer 28L. Collectively, the additional first electrically conductive metal or metal alloy material and the another first electrically conductive metal or metal alloy layer 28L may be referred to herein as first electrically conductive metal or metal alloy material 28. As is shown, the first electrically conductive metal or metal alloy material 28 completely fills in the via/line opening 25 and has an overburden portion that extends outside the combined via/line opening 25 and atop the second interconnect dielectric material layer 24. In the drawing, a boundary line is shown between the first electrically conductive metal or metal alloy liner 16L and the first electrically conductive metal or metal alloy material 28 for clarity reasons only; in reality no boundary (material interface) would be present between elements 16L and 28.

The additional first electrically conductive metal or metal alloy material includes the same electrically conductive metal or metal alloy material as the another first electrically conductive metal or metal alloy layer 28L. The additional first electrically conductive metal or metal alloy material may be formed be formed utilizing one of the techniques mentioned previously for forming the first electrically conductive metal or metal alloy layer 16.

Figure 11:
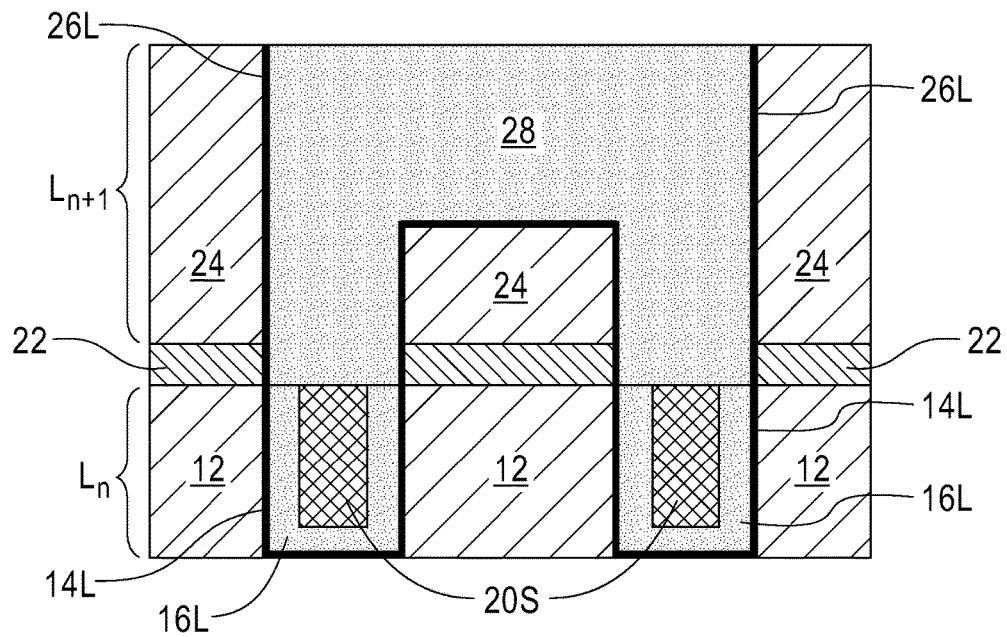
FIG. 11 is a cross sectional view of the exemplary semiconductor structure of FIG. 10 after performing a planarization process.

Referring now to FIG. 11, there is illustrated the exemplary semiconductor structure of FIG. 10 after performing a planarization process. The planarization process removes the overburden portion of the first electrically conductive metal or metal alloy material 28 as well as the second nucleation layer 26 from atop the second interconnect dielectric layer 24 providing the planarized structure shown in FIG. 11. The remaining second nucleation layer 26 that is present inside the combined via/line opening 25 may be referred to herein as a second nucleation liner 26L. At this point of the present application, the remaining portion of the first electrically conductive metal or metal alloy material 28 within the combined via/line opening 25 has a topmost surface that is coplanar with topmost surfaces of the second nucleation liner 26L and the second interconnect dielectric material layer 24. The planarization process may include chemical mechanical polishing and/or grinding.

Figure 12:
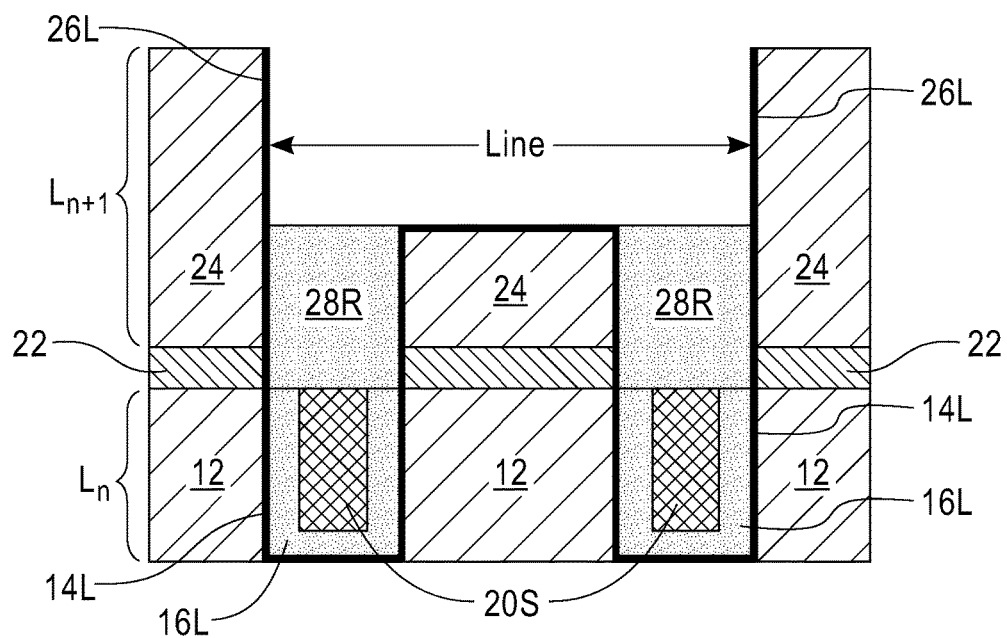
FIG. 12 is a cross sectional view of the exemplary semiconductor structure of FIG. 11 after removing the first electrically conductive metal or metal alloy material from the line portion of the at least one combined via/line opening.

Referring now to FIG. 12, there is illustrated the exemplary semiconductor structure of FIG. 11 after removing the first electrically conductive metal or metal alloy material 28 from the line portion of the at least one combined via/line opening 25. The removal of the first electrically conductive metal or metal alloy material 28 from the line portion of the combined via/line opening 25 may be performed utilizing a recess etch that is selective in removing the first electrically conductive metal or metal alloy material 28. After the recess etch, a portion of the first electrically conductive metal or metal alloy material 28 remains in the via portion of the combined via/line opening 25. The portion of the first electrically conductive metal or metal alloy material 28 that remains in the via portion of the combined via/line opening 25 may be referred to herein as a recessed first electrically conductive metal or metal alloy material 28R. In the drawing, a boundary line is shown between the first electrically conductive metal or metal alloy liner 16L and the recessed first electrically conductive metal or metal alloy material 28R for clarity reasons only; in reality no boundary (material interface) would be present between elements 16L and 28R.

Figure 13:
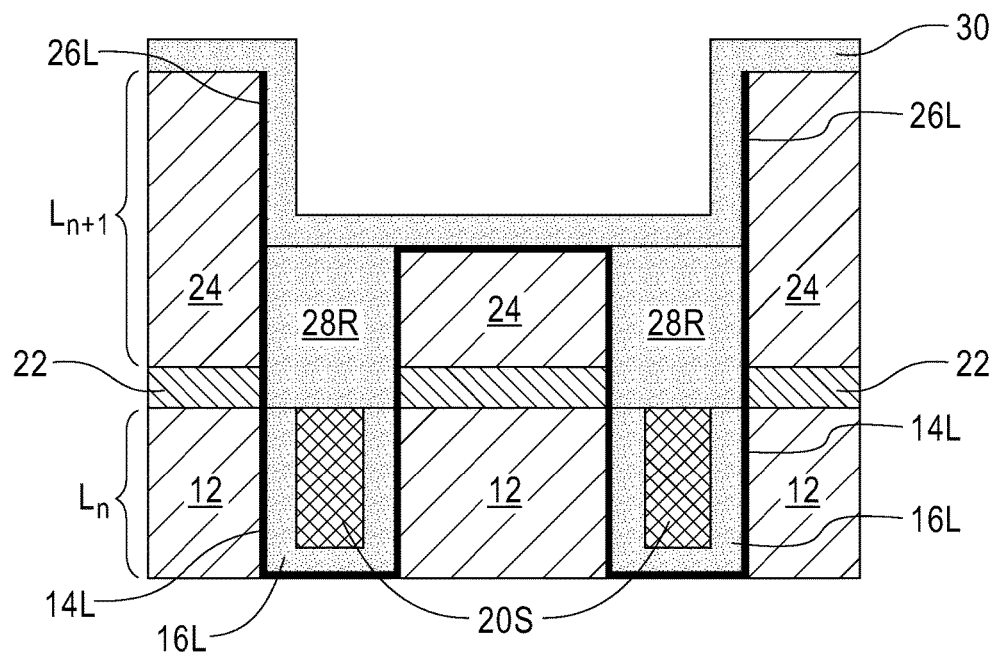
FIG. 13 is a cross sectional view of the exemplary semiconductor structure of FIG. 12 after forming yet another first electrically conductive metal or metal alloy layer.

Referring now to FIG. 13, there is illustrated the exemplary semiconductor structure of FIG. 12 after forming yet another first electrically conductive metal or metal alloy layer 30. The yet another first electrically conductive metal or metal alloy layer 30 is composed of a same electrically conductive metal or metal alloy as that which provided the first electrically conductive metal or metal alloy layer 16. The yet another first electrically conductive metal or metal alloy layer 30 may be formed utilizing one of the techniques mentioned previously for forming the first electrically conductive metal or metal alloy layer 16. The yet another first electrically conductive metal or metal alloy layer 30 has a thickness within the range mentioned previously for the first electrically conductive metal or metal alloy layer 16. In the drawing, a boundary line is shown between the recessed electrically conductive metal or metal alloy material 28 and the yet another first electrically conductive metal or metal alloy layer 30 for clarity reasons only; in reality no boundary (material interface) would be present between elements 28R and 30.

Figure 14:
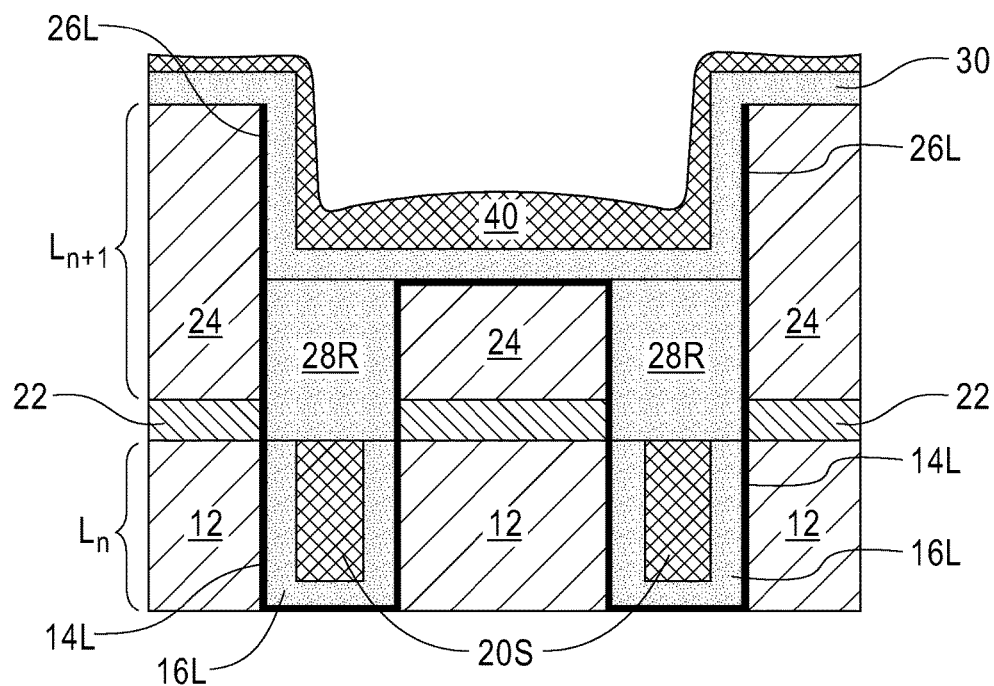
FIG. 14 is a cross sectional view of the exemplary semiconductor structure of FIG. 13 after forming another second electrically conductive metal or metal alloy layer having the second bulk resistivity and the first grain size.

Referring now to FIG. 14, there is illustrated the exemplary semiconductor structure of FIG. 13 after forming another second electrically conductive metal or metal alloy layer 40 having the second bulk resistivity and the first grain size. The another second electrically conductive metal or metal alloy layer 40 is composed of a same electrically conductive metal or metal alloy as that which provided the second electrically conductive metal or metal alloy layer 18. The another second electrically conductive metal or metal alloy layer 40 may be formed utilizing the high biased PVD process mentioned previously for forming the second electrically conductive metal or metal alloy layer 18. The another second electrically conductive metal or metal alloy layer 40 has a thickness within the range mentioned previously for the second electrically conductive metal or metal alloy layer 16. The first grain size of the another second electrically conductive metal or metal alloy layer 40 is within the first grain size mentioned above for the second electrically conductive metal or metal alloy layer 18.

Figure 15:
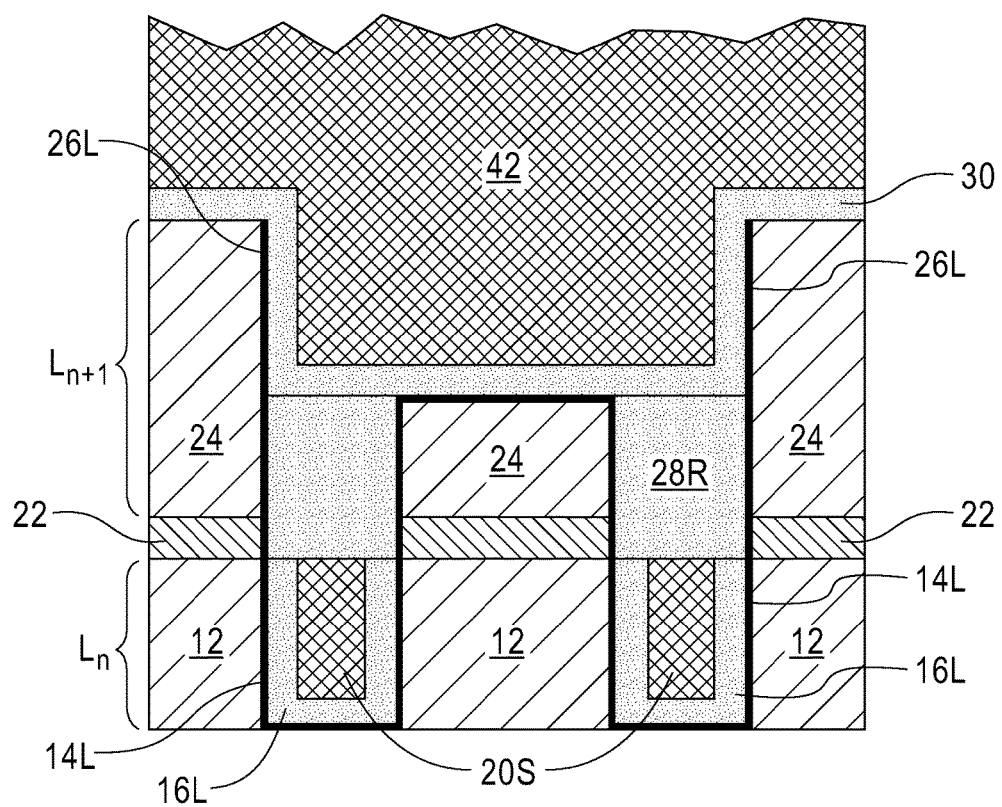
FIG. 15 is a cross sectional view of the exemplary semiconductor structure of FIG. 14 after performing a reflow anneal to reflow and convert the another second electrically conductive metal or metal alloy layer into another modified second electrically conductive metal or metal alloy layer having the second bulk resistivity and the second grain size that is greater than the first grain size.

Referring now to FIG. 15, there is illustrated the exemplary semiconductor structure of FIG. 14 after performing a reflow anneal to reflow and convert the another second electrically conductive metal or metal alloy layer 40 into another modified second electrically conductive metal or metal alloy layer 42 having the second bulk resistivity and the second grain size that is greater than the first grain size. The reflow anneal used in this step of the present application is the same as described in regard to providing the exemplary structure illustrated in FIG. 5 of the present application. The second grain size of the another modified second electrically conductive metal or metal alloy layer 42 is within the range mentioned above for the second grain size of the modified second electrically conductive metal or metal alloy layer 20. The steps shown in FIGS. 14 and 15 may be repeated any number of times as necessary to fill the line portion of the combined via/line opening 25.

Figure 16:
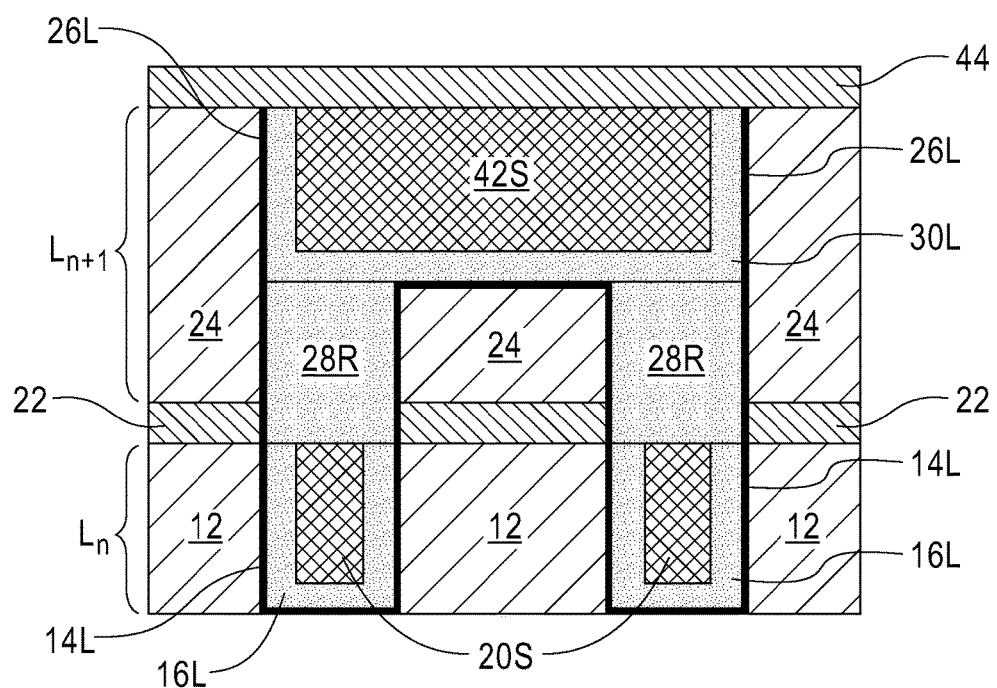
FIG. 16 is a cross sectional view of the exemplary semiconductor structure of FIG. 15 after performing a planarization process and forming a second dielectric capping layer above the upper interconnect level.

Referring now to FIG. 16, there is illustrated the exemplary semiconductor structure of FIG. 15 after performing a planarization process (as defined above) and forming a second dielectric capping layer 44 above the upper interconnect level, $L_{n+1}$. The planarization process removes any overburden portion of the another modified second electrically conductive metal or metal alloy layer 42 as well as the yet another first electrically conductive metal or metal alloy layer 30 from atop the second interconnect dielectric material layer 24. The remaining another modified second electrically conductive metal or metal alloy layer 42 that is left within the line portion of the combined via/line opening 25 may be referred to as another second electrically conductive structure 42S. The another second electrically conductive structure 42S and the second electrically conductive structure 20S include the same electrically conductive metal or metal alloy, i.e., copper having a large grain size, i.e., the second grain size mentioned above.

After planarization, a portion of the yet another first electrically conductive metal or metal alloy layer 30 remains in the line portion of the combined via/line opening 25. This remaining portion of the yet another first electrically conductive metal or metal alloy layer 30 may be referred to herein as a yet another first electrically conductive metal or metal alloy liner 30L. Collectively, the yet another first electrically conductive metal or metal alloy liner 30L and the another second electrically conductive structure 42S provide a binary metallization interconnect structure of the present application in the upper interconnect level, $L_{n+1}$. As is shown, the sidewall surfaces and the bottommost surface of the second electrically conductive structure 42S and 20S are surrounded by the first electrically conductive structure 30L and 16L, respectively, of the present application. In the drawing, a boundary line is shown between the first electrically conductive metal or metal alloy liner 16L and the recessed first electrically conductive metal and metal alloy material 28R and another boundary line is shown between the recessed first electrically conductive metal or metal alloy material 28R and the first electrically conductive metal or metal alloy structure 30L for clarity reasons only; in reality no boundary (material interface) would be present between elements 16L and 28R or between elements 28R and 30L.

Second dielectric capping layer 44 may include one of the dielectric capping materials mentioned above for the first dielectric capping layer 22. Second dielectric capping layer 44 may be formed utilizing one of the deposition processes mentioned above in forming the first dielectric capping layer 22. The second dielectric capping layer 44 may have a thickness that is within the range mentioned above for the first dielectric capping layer 22. In some embodiments, the second dielectric capping layer 44 is omitted. The present application contemplates embodiments in which (i) the first and second dielectric capping layers (22, 44) are both omitted; (ii) the first dielectric capping layer 22 is present and the second dielectric capping layer 44 is omitted; (iii) the first dielectric capping layer 22 is omitted and the second dielectric capping layer 44 is present; and (iv) the first and second dielectric capping layers (22, 44) are both present.

FIG. 16 illustrates an exemplary semiconductor structure of the present application. Notably, the exemplary semiconductor structure includes a lower interconnect level, $L_n$, that includes a first interconnect dielectric material layer 12 having an opening 13 that contains a first bimetallization interconnect structure (16L, 20S). An upper interconnect level, $L_{n+1}$, is located above the lower interconnect level, $L_n$. The upper interconnect level, $L_{n+1}$, includes a second interconnect dielectric material layer 24 having a combined via/line opening 25, wherein the line portion of the combined via/line opening 25 contains a second bimetallization interconnect structure (30L, 42S). In accordance with the present application, the first and second bimetallization interconnect structures comprise a first electrically conductive structure (i.e., 16L or 30L) composed of a first electrically conductive metal or metal alloy material having a first bulk resistivity surrounding a second electrically conductive structure (20S or 42S) composed of a second electrically conductive metal or metal alloy material having a second bulk resistivity that is less than the first bulk resistivity and a grain size greater than 10 nm. The via portion of the combined via/line opening 25 contains the first electrically conductive metal or metal alloy material (i.e., 28R shown in FIG. 16).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
 a lower interconnect level comprising a first interconnect dielectric material layer having an opening that contains a first bimetallization interconnect structure; and
 an upper interconnect level located above the lower interconnect level and comprising a second interconnect dielectric material layer having a combined via/line opening, wherein the line portion of the combined via/line opening contains a second bimetallization interconnect structure, wherein the first and second bimetallization interconnect structures comprise a first electrically conductive structure composed of a first electrically conductive metal or metal alloy material having a first bulk resistivity surrounding a second electrically conductive structure composed of a second electrically conductive metal or metal alloy material having a second bulk resistivity that is less than the first bulk resistivity and a grain size greater than 10 nm.

2. The semiconductor structure of claim 1, wherein the via portion of the combined via/line opening is filled with the first electrically conductive metal or metal alloy material and is directly connected to the opening in the first interconnect dielectric material layer.

3. The semiconductor structure of claim 1, wherein the first bulk resistivity is from 3.5 $\mu\Omega\cdot$cm to 8.0 $\mu\Omega\cdot$cm, wherein $\mu\Omega$ equals microohms.

4. The semiconductor structure of claim 3, wherein the first electrically conductive metal or metal alloy material is composed of cobalt (Co), ruthenium (Ru), rhodium (Rh), iridium (Ir), tungsten (W), nickel (Ni), osmium (Os), palladium (Pd), platinum (Pt) or alloys thereof.

5. The semiconductor structure of claim 1, wherein the second bulk resistivity is from 1.5 $\mu\Omega\cdot$cm to 3.0 $\mu\Omega\cdot$cm, wherein $\mu\Omega$ equals microohms.

6. The semiconductor structure of claim 5, wherein second electrically conductive metal or metal alloy material comprises copper (Cu), aluminum (Al), or a copper-aluminum (Cu—Al) alloy.

7. The semiconductor structure of claim 1, further comprising a nucleation liner located on at least sidewall surfaces of the first electrically conductive metal or metal alloy material.

8. The semiconductor structure of claim 7, wherein the nucleation liner comprises Ru, RuTi, RuTa, RuNb, RuW, Ta, TaTi, TW, TaNb, TaMo, Ta/TiN, TaNbN, TaWN, TaMoN, Ti, TiN, TiTaN, W or WN.

9. The semiconductor structure of claim 1, further comprising a dielectric capping layer separating the first interconnect dielectric material layer from the second interconnect dielectric material layer.

10. The semiconductor structure of claim 9, further comprising another dielectric capping layer located on the upper interconnect level.

* * * * *